United States Patent
Straemke

[11] Patent Number: 6,056,849
[45] Date of Patent: May 2, 2000

[54] APPARATUS FOR THE SURFACE TREATMENT OF WORKPIECES BY MEANS OF A PLASMA

[76] Inventor: Siegfried Straemke, Fichtenhain 6, 52538 Selfkant, Germany

[21] Appl. No.: 09/003,091

[22] Filed: Jan. 6, 1998

[30] Foreign Application Priority Data

Jan. 7, 1997 [DE] Germany .................. 297 00 113 U
Jul. 22, 1997 [DE] Germany .................. 297 12 960 U

[51] Int. Cl.[7] ........................ C23F 1/02; C23C 16/00
[52] U.S. Cl. ............ 156/345; 118/719; 118/728; 118/730
[58] Field of Search .................. 118/719, 723 R, 118/718, 729, 730; 204/298.25, 298.35; 156/345; 414/219, 935, 939

[56] References Cited

U.S. PATENT DOCUMENTS

| | | | |
|---|---|---|---|
| 5,314,574 | 5/1994 | Takahashi | 156/646 |
| 5,554,249 | 9/1996 | Hasegawa et al. | 156/345 |
| 5,611,861 | 3/1997 | Higashi | 118/719 |
| 5,628,828 | 5/1997 | Kawamura et al. | 118/719 |
| 5,667,592 | 9/1997 | Boitnott et al. | 118/719 |
| 5,766,360 | 6/1998 | Sato et al. | 118/666 |
| 5,913,978 | 6/1999 | Kato et al. | 118/719 |

*Primary Examiner*—Richard Bueker
*Assistant Examiner*—Luz Alejandro
*Attorney, Agent, or Firm*—Diller, Ramik & Wight, PC

[57] ABSTRACT

In an apparatus for the processing of workpieces and the surface treatment thereof by means of a plasma, a processing chamber (11) to process workpieces and a treatment chamber (10) for the surface treatment of the workpieces by means of a plasma are united in one device. The two chambers (10, 11) are sealed against the environment in a gastight manner and separated from each other by means of a gastight door (12). Thus, workpieces (15) can be machined in the processing chamber (11) by means of a tool (20) while the door (12) is closed. After processing, the conditions in the two chambers (10, 11) are adapted, for example by introducing the same gas into the processing chamber (11) as into the treatment chamber (10). After the pressure in the two chambers (10, 11) has been equalized, the door (12) is opened by displacement, and the workpieces (15) are transferred into the treatment chamber (10).

6 Claims, 1 Drawing Sheet

APPARATUS FOR THE SURFACE TREATMENT OF WORKPIECES BY MEANS OF A PLASMA

BACKGROUND OF THE INVENTION

The present invention refers to an apparatus for the surface treatment of workpieces by means of a plasma.

In the case of a surface treatment, for example plasma nitration, plasma carburization as well as the coating of workpieces by means of the PVD or CVD method, the surface of the workpiece has to meet high requirements. If the surface of the workpiece is contaminated, oxidized or passivated, a cleaning process has to take place prior to the treatment by a plasma.

If the workpieces are subjected to a machining process prior to the treatment by a plasma, they are intermediately stored subsequent to this process or at least have to be transported from the processing device to the surface treatment device. In this case the workpieces are subject to ambient influences. For example, the treated surfaces oxidize because of the humidity of the air. Therefore, it is indispensable to clean the workpieces prior to surface treatment.

In a cleaning process, impurities such as oils and greases have to be removed. The processes involved are very cumbersome, as the surface of the workpiece might be passivated, especially, if non-volatile impurities are involved. A nitration of aluminum workpieces, for example, is very difficult, as an aluminum oxide layer, acting as a diffusion inhibitor, immediately forms when the aluminum comes into contact with air. As the oxide layer is an adherent layer, it is extremely difficult to remove.

From U.S. Pat. No. 5,216,223, a plasma treatment apparatus is known comprising a treatment chamber which can be evacuated. To insert and remove workpieces into and from the treatment chamber during the operation of the vacuum, the treatment chamber has a sluice arranged upstream thereof for introducing the workpieces and a sluice arranged downstream thereof for removing workpieces. The sluice for removing the workpieces from the treatment chamber comprises two lateral doors leading towards aftertreatment chambers. These aftertreatment chambers each comprise a door leading to the outside. The aftertreatment chambers arranged downstream of the sluice for removing the workpieces serve to aftertreat chemically or thermally the surfaces previously treated in a surface treatment process by means of a plasma. Even in the apparatus known from U.S. Pat. No. 5,216,223, it is necessary to clean the workpieces prior to the introduction thereof into the treatment chamber for a surface treatment by means of a plasma.

SUMMARY OF THE INVENTION

It is the objective of the invention to provide an apparatus allowing a surface treatment by means of a plasma of workpieces which are extremely susceptible to contamination.

According to the invention, a processing chamber comprising a machining device is arranged upstream of a treatment chamber for the surface treatment of workpieces. The two chambers form a single unit sealed against the atmosphere so that no ambient influences are present when the workpieces are transferred from the processing chamber to the treatment chamber. In the processing chamber, various machining tools can be provided for fine machining, for instance abrading, polishing, honing or lapping. Furthermore, a processing center with an automatic change of tools can be provided in the processing chamber. The treatment chamber for the surface treatment of the workpieces comprises energy and gas supply means required for the production of a plasma as well as evacuation means.

The two chambers united in a device are sealed against each other and against the environment in a gastight manner. The processing chamber is separated from the treatment chamber by a gastight door or sluice. Thus, a workpiece can be processed in the processing chamber with the door or sluice being closed. If the two chambers are separated from each other by a door, the condition of the processing chamber is adapted to the condition of the treatment chamber after the processing has been finished. If the treatment chamber has been evacuated to prepare for a plasma coating, the processing chamber is also evacuated. As soon as the pressure has been equalized, the door is opened and the workpiece is transferred into the treatment chamber. Preferably, a transport device is arranged between the two chambers for this purpose.

If a sluice is provided between the two chambers, it is not necessary to adapt the condition of the processing chamber to that of the treatment chamber. Rather, a first sluice door is opened, and the workpiece is transported from the processing chamber into the sluice. After the first sluice door has been closed, only the condition of the sluice has to be adapted. Then the second sluice door is opened, and the workpiece is transferred into the treatment chamber. Especially in the case of large treatment chambers, it is advantageous to provide a sluice instead of a door, as only the condition of the relatively small sluice has to be changed instead of that of the entire processing chamber.

As, according to the invention, the processing and the treatment chambers are provided in a single device and are separated from each other by means of a gastight door or sluice, the workpiece is not subject to ambient influences after being processed. Thus, the processed surface of the workpiece is not contaminated. Particularly, no ambient conditions are present due to which the surface is oxidized or passivated. This is particularly advantageous if the surface of a workpiece is to be treated which consists of a substance susceptible to ambient influences. If, for example, the surface of a workpiece of aluminum is to be nitrated in the treatment chamber, no aluminum oxide must be present on the surface. The surface to be nitrated is mechanically processed in the processing chamber and then transported directly through the door or sluice into the treatment chamber. As the workpiece is not subject to ambient influences due to the connection of the processing chamber to the treatment chamber according to the invention, no aluminum oxide layer can form on the surfaces to be nitrated. Thus, a cumbersome cleaning process of the workpieces before the treatment of the surfaces thereof in the treatment chamber is not required. Only processing residues such as chips are removed, for instance by suction. This can already occur in the processing chamber.

The door separating the two chambers can be formed as a revolving door. In this case, this is a flat door rotatable around a central axis. According to the invention, the revolving door also serves as a workpiece support. The workpiece to be processed is directly clamped on one side of the revolving door. The workpiece is processed in the processing chamber in a defined atmosphere. After the treatment, the condition of the two chambers is equalized and the revolving door is turned around its central axis by 180°. Thus, the workpiece just processed gets into the treatment chamber, and the workpiece previously treated in the treatment chamber, which is clamped on the opposite side of the revolving door, is turned back into the processing chamber. While the workpiece present in the treatment chamber is being treated, the workpiece present in the treatment chamber is taken out of the workpiece support connected to the revolving door. Then, while the surface treatment in the treatment chamber continues, another workpiece can be clamped onto the workpiece support while still in the processing chamber and can be processed accordingly. This embodiment of the invention is particularly suited for processing and treating workpieces individually or for a small quantity of workpieces to be processed and treated.

Instead of a revolving door with two opposite surfaces whereon the workpiece carriers are provided and which are rotated by 180° in each case, a cylindrical or polygonal revolving door can be provided. On each of the lateral surfaces of a revolving door rotatable around a central axis, a workpiece carrier is provided. One or a plurality of surfaces of the revolving door are located in the processing chamber, and the remaining surfaces are located in the treatment chamber. Thus, multiple workpieces can be processed and treated at the same time.

A neutral, oxidizing or reducing gas may be introduced into the treatment chamber to allow a workpiece to be processed in a defined atmosphere. Furthermore, the treatment chamber can be filled with an appropriate liquid, for instance alcohol, for the purpose of cleaning the workpieces, so that the workpieces can be mechanically processed in the liquid.

The medium present in the processing chamber during processing circulates, preferably cyclically or continuously. Thus, the medium is cleaned from chips and impurities so that the operating conditions remain constant. Additionally, it is ensured that no chips or other impurities get from the processing chamber into the treatment chamber when the door or sluice is opened.

Furthermore, multiple chambers may be provided to optimize the processing and/or the treatment. For example, multiple processing chambers can be arranged behind one another, being separated from one another by means of gastight doors or sluices. Thus, several processing steps, for example in different atmospheres, can be executed consecutively. Downstream of the last processing chamber, the treatment chamber is provided, which is separated from the last processing chamber by means of a gastight door or sluice. In the same manner, multiple treatment chambers can be arranged behind one another, being separated from one another by means of gastight doors or sluices, to execute various treatments of a workpiece.

Furthermore, multiple processing and/or treatment chambers can be arranged alongside one another. Thus, the size of the chamber is limited in the case of certain processing and/or treatment methods. Therefore, in the case of a treatment with several steps, multiple workpieces can be transported from the larger treatment chamber into multiple small treatment chambers arranged alongside one another. Due to the combination of multiple processing and/or treatment chambers, the processing and treatment of workpieces can be optimized.

BRIEF DESCRIPTION OF THE DRAWINGS

Referring to the accompanying drawings, there now follows a more detailed description of the invention with regard to preferred embodiments thereof.

DESCRIPTION OF THE PREFERRED EMBODIMENTS

Figure 1:
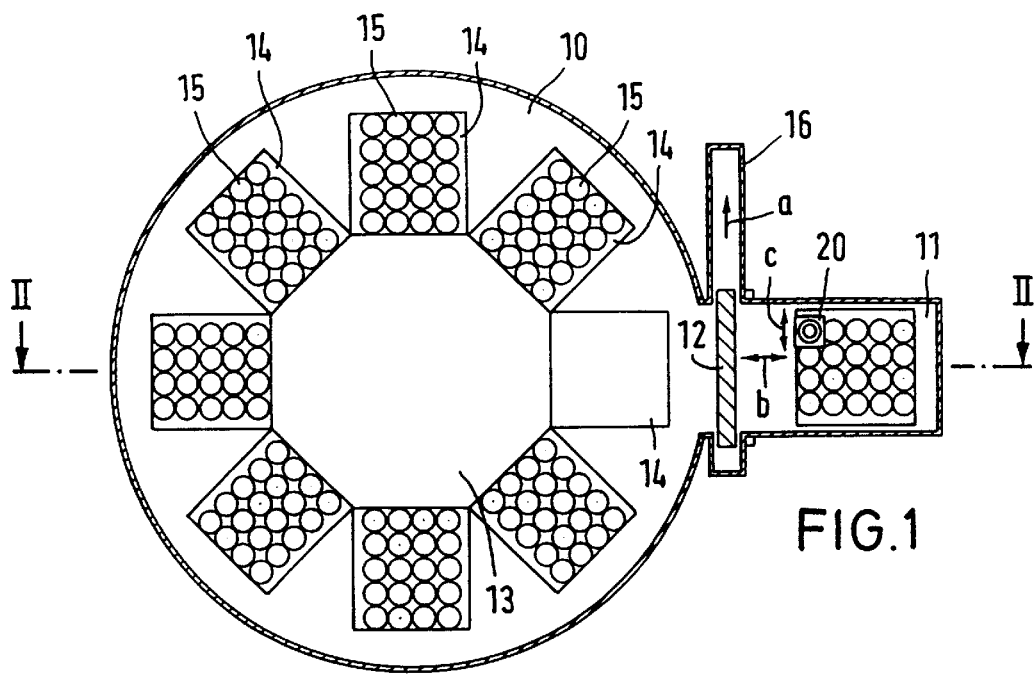
FIG. 1 shows a schematic horizontal section of a first preferred embodiment of the invention.

The embodiment represented in FIG. 1 comprises a treatment chamber 10, a processing chamber 11 and a displaceable door 12 separating the two chambers. In the treatment chamber 10, a carrousel 13 is provided comprising, distributed on the circumference thereof, multiple workpiece supports 14. A charge of workpieces 15 is arranged on each of the workpiece supports 14. The charges or workpieces are inserted into the treatment chamber 10 through a closable opening (not shown) or by the lid of the treatment chamber 10 being taken off.

The displaceable door 12 separates the treatment chamber 10 in a gastight manner from the processing chamber 11. To transfer workpieces 15 from one of the two chambers into the other chamber, the door 12 is displaced in the direction of an arrow a into a pocket 16. Thus the two chambers 10, 11 are connected to each other, and the workpieces can be displaced from the processing chamber 11 into the treatment chamber 10 or vice versa by means of a transporting means (not show).

Figure 2:
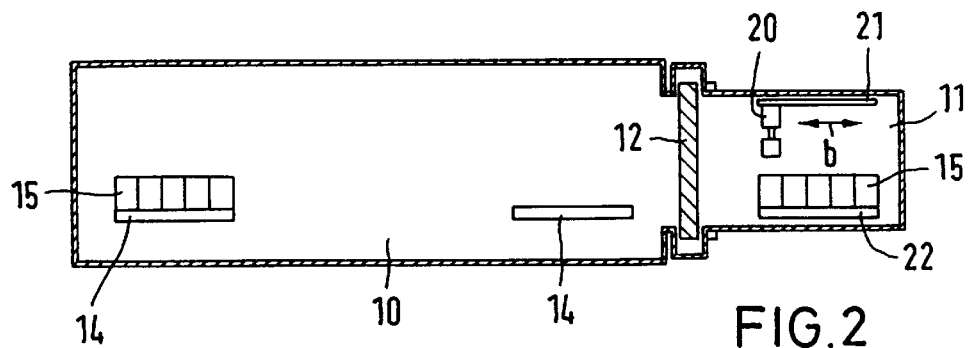
FIG. 2 shows a sectional view along line II—II of FIG. 1.

As is represented in the sectional view shown in FIG. 2, the workpieces 15 present in the treatment chamber 11 can be treated by a tool 20. The tool 20 is displaceable in a guide 21 in the direction of an arrow b and an arrow c (FIG. 1). The workpieces 15 are fixed in the processing chamber 11 on a workpiece support 22. The treatment of the workpiece is provided by CNC-control by means of a computer.

In a first operational step, the workpieces 15 are inserted into the treatment chamber 10. For this purpose, the workpieces 15 are fixed onto the workpiece supports 14 in a plurality of charges through an opening or by the lid being taken off. As soon as the carrousel 13 is fitted completely, the treatment chamber 10 is closed. The gastight door 12 is advanced into the pocket 16 so that the treatment chamber 10 is connected to the processing chamber 11. The two chambers 10, 11 remain closed to the environment in a gastight manner, even if the door 12 is open. By means of a transport device (not shown), for example a robot arm, a first workpiece charge is transported from the workpiece support 14 of the carrousel 13 arranged opposite the processing chamber 11 into the processing chamber 11. Here, the workpieces 15 of this charge are fixed onto a workpiece support 22 in the processing chamber 11. Then the door 12 is displaced so that the two chambers 10, 11 are separated from each other in a gastight manner.

The processing chamber 11 can be evacuated and/or filled with a gas or a liquid to process the workpieces 15 mechanically. While the workpieces 15 are being processed, the medium present in the processing chamber 11 circulates cyclically or continuously to maintain a constant operational atmosphere and to filter out chips.

As soon as all of the workpieces 15 of a charge have been processed, the processing chamber 11 is evacuated to remove the processing gas from the processing chamber. If gas has been introduced into the treatment chamber 10 while the first workpiece charge has been processed, the same gas is introduced into the processing chamber 11 until the pressure between the two chambers 10, 11 has been equalized. If the treatment chamber 10 has only been evacuated while the first workpiece charge has been processed, the processing chamber 11 is evacuated until the pressure between the two chambers 10, 11 has been equalized. Then the door 12 is advanced into the pocket 16 and the workpieces 15 are transported by means of the transport means from the processing chamber 11 onto the free workpiece support 14 arranged opposite the processing chamber 11. During the transport between the processing chamber 11 and the treatment chamber 10, the workpieces are not subject to any ambient influences, so that the mechanically processed surface of the workpieces cannot oxidize. As soon as all of the workpieces 15 of the processed charge have been transported from the processing chamber 11 into the treatment chamber 10, the carrousel 13 is advanced rotatingly by one workpiece support 14 so that the next workpiece charge can be transported from the processing chamber into the treatment chamber. Now the door 12 is closed again, and the aforementioned operational steps are repeated.

The aforementioned operational steps are executed consecutively for such a number of times that all of the workpiece charges present on the workpiece supports 14 of the carrousel 13 have been processed in the processing chamber 11. Then the workpieces 15 are subjected to a surface treatment by means of plasma in the treatment chamber. For this purpose, the treatment chamber 10 is evacuated and further comprises connections for introducing treatment gases. Furthermore, electrode terminals are provided in the treatment chamber 10 for the plasma treatment. If the surface treatment of the workpieces 15 present in the treatment chamber 10 has been finished, they are removed from the treatment chamber 10, again through the opening of the treatment chamber 10 or by the lid being taken off.

Instead of the process described above, it is also possible to insert the workpieces via the processing chamber 11 into the treatment chamber 10. For this purpose, the workpieces 15 are supplied to the processing chamber 11 via an opening and are transported into the treatment chamber 10 as described above. The next charge of workpieces 15 is again at first supplied to the processing chamber 11 to be transported into the treatment chamber 10 afterwards. Thus, the treatment chamber 10 does not have to comprise an opening or a lid which can be taken off. To remove workpieces 15 from the treatment chamber 10, these will again have to be removed from the processing chamber 11.

Figure 3:
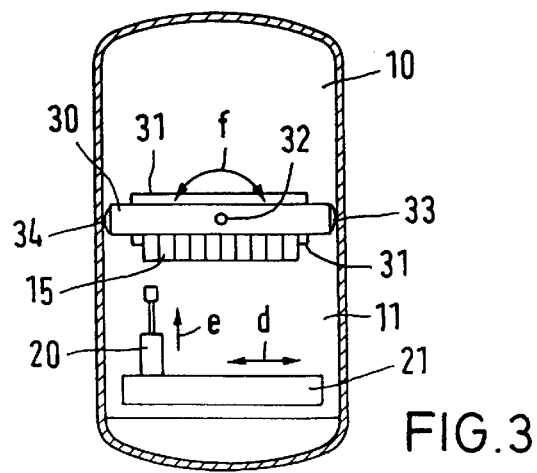
FIG. 3 shows a schematic top plan view of a second preferred embodiment cut open.

The device represented in FIG. 3 for processing workpieces and treating the surfaces thereof by means of a plasma also comprises a treatment chamber 10 and a processing chamber 11. The two chambers 10, 11 are separated from each other by means of a revolving door 30. The revolving door 30 comprises a workpiece support 31 both on the side directed towards the treatment chamber 10 and on the side directed towards the processing chamber 11. The revolving door 30 is rotatable around a central axis 32. Provided on the frontal faces of the revolving door 30 are seals 33, 34 sealing the two chambers 10, 11 against each other when the revolving door 30 is closed so that different conditions can be present in the two chambers 10, 11. As the two chambers 10, 11 are arranged within a common device which is sealable against the environment in a gastight manner, the workpiece clamped on the workpiece support 31 is not subject to ambient influences when the revolving door 30 is turned.

Workpieces 15 of a workpiece charge are clamped on the side of the revolving door 30 directed towards the processing chamber 11. To treat the workpiece 15, a tool 20 is provided which can be moved in a guide 21 both in the direction of the arrow d and transversely to the plane of projection. For processing purposes, the tool 20 is further advanceable in the direction of the arrow e towards the workpieces 15 in the workpiece charge.

After the workpieces 15 have been processed, the condition in the processing chamber is equalized with the condition of the treatment chamber 10 via evacuation and gas connections. Then the revolving door 30 is rotated around the central axis 32 in the direction of the arrow f by 1800 so that the workpieces 15 are located in the treatment chamber 10. The treatment chamber 10 also comprises connections for evacuating and for supplying treatment gases as well as electrode terminals so that a plasma treatment of the workpieces 15 can be executed in the treatment chamber.

While the surface of the workpieces 15 is being treated in the treatment chamber 10, the processing chamber 11 can be opened, and a new workpiece can be clamped onto the workpiece support 31. If a previously treated workpiece is located on the workpiece support 31, this is detached from the workpiece support 31 and removed from the processing chamber 11.

After the processing chamber 11 has been closed, the newly clamped workpiece is processed in a defined atmosphere, again by means of the tool 20. Thus, while workpieces on the side of the processing chamber 11 directed towards the revolving door 30 in the treatment chamber 10 are rechucked and processed, workpieces 15 which are clamped on a corresponding workpiece support 31 on the side of the revolving door 30 directed towards the treatment chamber 10 can be treated.

I claim:

1. Apparatus for surface treating workpieces by a plasma comprising a plasma treatment chamber (10), means for evacuating the treatment chamber (10), means for producing a plasma in the treatment chamber (10), a processing chamber (11) downstream of said treatment chamber (10), an opening between the treatment chamber (10) and the processing chamber (11), door means (12) for reciprocally slidably opening and closing the opening; means for conveying workpieces into, out of and between the treatment chamber (10) and the processing chamber (11) through the opening in an open position of said door means (12); processing means (20) in said processing chamber (11) for machining workpieces in said processing chamber (11) in a closed position of said door means (12), means for creating a seal relative to said door means (12) in the closed position thereof, means for creating other than ambient atmosphere in said processing chamber (11) during the machining of workpieces by said processing means (20) whereby oxidation of machined surfaces is prevented, means for preventing oxidation of the workpieces after the machining thereof upon the movement of said door means (12) to said open position and the return of said machined workpieces to said treatment chamber (10), and means for cleansing said processing chamber (11) of machining chips and impurities.

2. The apparatus for surface treating workpieces as defined in claim 1 wherein said oxidation preventing means includes means for creating an atmosphere in said treatment chamber (10) corresponding to the other than ambient atmosphere in said processing chamber (11).

3. The apparatus for surface treating workpieces as defined in claim 1 including means for equalizing pressure in said treatment chamber (10) and said processing chamber (11) at a time at least prior to the opening of said door means (12) and the removal of the machined workpieces therefrom.

4. Apparatus for surface treating workpieces by a plasma comprising a plasma treatment chamber (10), means for evacuating the treatment chamber (10), means for producing a plasma in the treatment chamber (10), a processing chamber (11) downstream of said treatment chamber (10), an opening between the treatment chamber (10) and the processing chamber (11), door means (30) for rotatably opening and closing the opening; means for conveying workpieces into, out of and between the treatment chamber (10) and the processing chamber (11) through the opening in an open position of said door means (30); processing means (20) in said processing chamber (11) for machining workpieces in said processing chamber (11) in a closed position of said door means (30), means for creating a seal relative to said door means (30) in the closed position thereof, means for creating other than ambient atmosphere in said processing chamber (11) during the machining of workpieces by said processing means (20) whereby oxidation of machined surfaces is prevented, means for preventing oxidation of the workpieces after the machining thereof upon the movement of said door means (30) to said open position and the return of said machined workpieces to said treatment chamber (10), and means for cleansing said processing chamber (11) of machining chips and impurities.

5. The apparatus for surface treating workpieces as defined in claim 4 wherein said oxidation preventing means includes means for creating an atmosphere in said treatment chamber (10) corresponding to the other than ambient atmosphere in said processing chamber (11).

6. The apparatus for surface treating workpieces as defined in claim 4 including means for equalizing pressure in said treatment chamber (10) and said processing chamber (11) at a time at least prior to the opening of said door means (12) and the removal of the machined workpieces therefrom.

* * * * *